United States Patent
Strittmatter et al.

(10) Patent No.: US 11,751,320 B2
(45) Date of Patent: Sep. 5, 2023

(54) AUTOMATION FIELD DEVICE

(71) Applicant: Endress+Hauser SE+Co. KG, Maulburg (DE)

(72) Inventors: Christian Strittmatter, Rickenbach (DE); Simon Gerwig, Schopfheim (DE); Andreas Fuz, Efringen-Kirchen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 93 days.

(21) Appl. No.: 17/626,873

(22) PCT Filed: Jun. 18, 2020

(86) PCT No.: PCT/EP2020/066981
§ 371 (c)(1),
(2) Date: Jan. 13, 2022

(87) PCT Pub. No.: WO2021/008809
PCT Pub. Date: Jan. 21, 2021

(65) Prior Publication Data
US 2022/0330418 A1    Oct. 13, 2022

(30) Foreign Application Priority Data
Jul. 17, 2019    (DE) .................... 10 2019 119 426.1

(51) Int. Cl.
*H05K 1/02*    (2006.01)
(52) U.S. Cl.
CPC ......... *H05K 1/0222* (2013.01); *H05K 1/0215* (2013.01)

(58) Field of Classification Search
CPC ........................................ H05K 1/0215–0228
See application file for complete search history.

(56) References Cited

U.S. PATENT DOCUMENTS 6,070,469 A * 6/2000 Taniguchi ........... G01L 19/0038
73/715
6,138,347 A   10/2000 Persson et al.
(Continued)

FOREIGN PATENT DOCUMENTS

CN    109425378 A1    3/2019
DE     19735409 A1    3/1999
(Continued)

*Primary Examiner* — Hoa C Nguyen
(74) *Attorney, Agent, or Firm* — Mark A. Logan; Endress+Hauser (USA) Holding, Inc.

(57) ABSTRACT

An automation field device comprises a housing that surrounds an inner space; a sensor- and/or actuator element arranged at the housing; an electronic circuit arranged in the housing and having a round, outer contour and a plurality of spring contacts in an edge region. The inner contour of the housing and the edge contour of the first circuit board are adapted to one another so that the first circuit board is introducible into the housing with a main plane orthogonal to a longitudinal axis of the housing. The spring contacts are so arranged on the first circuit board and embodied to hold the first circuit board in the inner space and to produce an electrical connection between the first circuit board and the housing to drain away disturbance currents from the first circuit board.

6 Claims, 2 Drawing Sheets

(56) References Cited

U.S. PATENT DOCUMENTS

| | | | | |
|---|---|---|---|---|
| 6,176,137 | B1* | 1/2001 | Sasaki | G01L 19/147 73/754 |
| 6,227,055 | B1* | 5/2001 | Pitzer | G01L 19/0084 73/715 |
| 6,457,368 | B1* | 10/2002 | Sasaki | G01L 19/148 73/753 |
| 6,609,427 | B1* | 8/2003 | Westfield | G01L 19/083 73/717 |
| 7,252,009 | B2* | 8/2007 | Kosh | G01L 19/143 73/753 |
| 8,286,496 | B2* | 10/2012 | Sekiya | G01L 19/148 73/756 |
| 11,162,970 | B2* | 11/2021 | Anderson | G01P 13/025 |
| 2005/0145035 | A1* | 7/2005 | Kopp | G01L 19/148 73/756 |
| 2006/0042393 | A1* | 3/2006 | Kaneko | G01L 19/148 73/753 |
| 2006/0055006 | A1 | 3/2006 | Orth et al. | |
| 2017/0015347 | A1* | 1/2017 | Asao | B62D 5/046 |
| 2018/0160574 | A1 | 6/2018 | Michalski et al. | |
| 2019/0128712 | A1* | 5/2019 | Kawamoto | G01F 1/115 |
| 2021/0006134 | A1* | 1/2021 | Ichikawa | H02K 11/33 |

FOREIGN PATENT DOCUMENTS

| | | |
|---|---|---|
| DE | 102011088302 A1 | 6/2013 |
| DE | 102015107306 A1 | 11/2016 |
| EP | 1790204 B1 | 12/2016 |

* cited by examiner

AUTOMATION FIELD DEVICE

CROSS-REFERENCE TO RELATED APPLICATIONS

The present application is related to and claims the priority benefit of German Patent Application No. 10 2019 119 426.1, filed on Jul. 17, 2019 and International Patent Application No. PCT/EP2020/066981, filed on Jun. 18, 2020, the entire contents of which are incorporated herein by reference.

TECHNICAL FIELD

The invention relates to an automation field device.

BACKGROUND

Known from the state of the art are field devices, which are used in industrial plants. In process automation technology, as well as in manufacturing automation technology, field devices are often applied. Referred to as field devices are, in principle, all devices, which are applied near to a process and which deliver, or process, process relevant information. Field devices are used for registering and/or influencing process variables. Serving for registering process variables are measuring devices, or sensors. Such are used, for example, for pressure- and temperature measurement, conductivity measurement, flow measurement, etc. and register the corresponding process variables, pressure, temperature, conductivity, pH value, fill level, flow, etc. Used for influencing process variables are actuators. Such are, for example, pumps or valves, which can influence the flow of a liquid in a tube or pipe or the fill level in a container. Besides the above mentioned measuring devices and actuators, referred to as field devices are also remote I/Os, radio adapters, and, in general, devices, which are arranged at the field level.

A large number of such field devices are produced and sold by the Endress+Hauser group of companies.

Usually, the housings of field devices are made of an electrically conductive material, especially metal. In such case, a grounding of the field device electronics located in the housing can occur via a housing wall. Usually, the ground connection uses screws and/or clamps. This assumes a metallized region on a circuit board (edge metallizing) or a grounding lug. These are relatively complicated to implement in the production of the field device.

SUMMARY

Starting from the above considerations, it is an object of the invention to provide an as simple as possible grounding of a field device electronics in a field device housing.

The automation field device of the invention comprises:
  a housing, which surrounds an inner space, which has a cross sectionally preferably round, inner contour;
  a sensor- and/or actuator element arranged at the housing for setting and/or registering a process variable;
  an electronic circuit arranged in the housing for operating the sensor- and/or actuator element, wherein the electronic circuit has at least one circuit board with a preferably round, outer contour and a plurality of spring contacts in an edge region, wherein the inner contour of the housing and the edge contour of the first circuit board are so adapted to one another that the first circuit board is introducible into the housing with a main plane, in which it is embodied, lying orthogonally to a longitudinal axis, which extends through the inner space of the housing, and the spring contacts are so arranged on the first circuit board and embodied to hold at least the first circuit board in this position in the inner space and, furthermore, to produce an electrical connection between the first circuit board and the housing, in order to lead disturbance currents from the first circuit board via the spring contacts to the housing.

According to the invention, an automation field device is provided, in the case of which the grounding is implemented via spring contacts. This offers the advantage that no screw/terminal connection is required and, thus, a working step in the production of the field device can be omitted. A further advantage compared with a terminal/screw variant provides that the circuit board can be made with less cost, since edge metallizings are no longer necessary. Other advantages include that tolerances in the housing or the circuit board can be accommodated via the amount of spring movement of the spring contacts and/or that in the case of vibrations of the field device scarcely any friction occurs on the contact areas, since the springs can accommodate the large part of the vibration via the amount of spring movement.

An advantageous embodiment of the automation field device of the invention provides that the spring contacts are arranged essentially rotationally symmetrically in the edge region of the first circuit board.

DETAILED DESCRIPTION

Another advantageous embodiment of the automation field device of the invention provides that the electronic circuit includes at least one other circuit board, which is electrically connected with the first circuit board, and wherein the first circuit board (5a) includes, furthermore, electronic components, which are embodied to implement EMC measures, especially EMC filter measures and/or EMC draining measures.

In turn, another advantageous embodiment of the automation field device of the invention provides that the first circuit board has a plurality of plies, of which at least one ply comprises an essentially continuous copper ply, such that the first circuit board divides the inner space into an EMC shielded region and a non-EMC shielded region. Of course, in spite of the at least one continuous copper ply, contacts from one surface to another, e.g. in the form of vias and/or microvias, can be present in the circuit board and, especially, the continuous copper ply can also have contacts from one surface to another.

Another advantageous embodiment of the automation field device of the invention provides that the field device includes, furthermore, a field device interface, preferably a plug connector, especially preferably an M12 plug connector, mounted in the housing for data communication, wherein the field device interface has, furthermore, an electrical ground contact, via which the first circuit board is connected with the field device interface, in order to drain away disturbance currents.

BRIEF DESCRIPTION OF THE DRAWINGS

The invention will now be explained in greater detail based on the appended drawing, the figures of which show as follows:

FIG. 1a shows a plan view of the first circuit board 5a, which serves as part of an electronic circuit 5 for a field device 1 of automation technology. The first circuit board 5a is embodied to implement EMC measures, especially EMC filter measures and/or EMC draining measures. For this, the first circuit board 5a can have an EMC filter, which is embodied, for example, in the form of two EMC chokes. The first circuit board 5a has a round outer contour, which is adapted in such a manner to an inner space 3 of a housing 2 of a field device 1 that the first circuit board 5a is introducible transversely into the inner space 3. Furthermore, the first circuit board 5a includes a plurality of rotationally symmetrically arranged spring contacts 5c in an edge region 5b. The spring contacts 5c are embodied, in such case, in such a manner that they have a (right angled) trapezoidal cross section. The spring contacts 5c are arranged in such a manner in the edge region 5b of the first circuit board 5a that such protrude with outwardly bent legs beyond the circuit board edge. In this way, on the one hand, the first circuit board 5a can, after its introduction into the inner space 3 of the housing 2, be positioned in such and, on the other hand, disturbance signals can be drained away via the spring contacts 5c to the housing wall. Because of the rotationally symmetric arrangement of the spring contacts 5c, disturbance currents can be drained away relatively uniformly via the housing wall.

In order to be able to implement with the first circuit board 5a a separation between an EMC shielded ("Faraday cage") region and a non-shielded EMC region, the first circuit board 5a can have a plurality of circuit board plies 5f-5i, of which at least one circuit board ply 5g is embodied in the form of a continuous copper conductor plate ply.

Furthermore, the first circuit board can 5a have vias and/or microvias for electrical contacting between ply surfaces.

Figure 2:
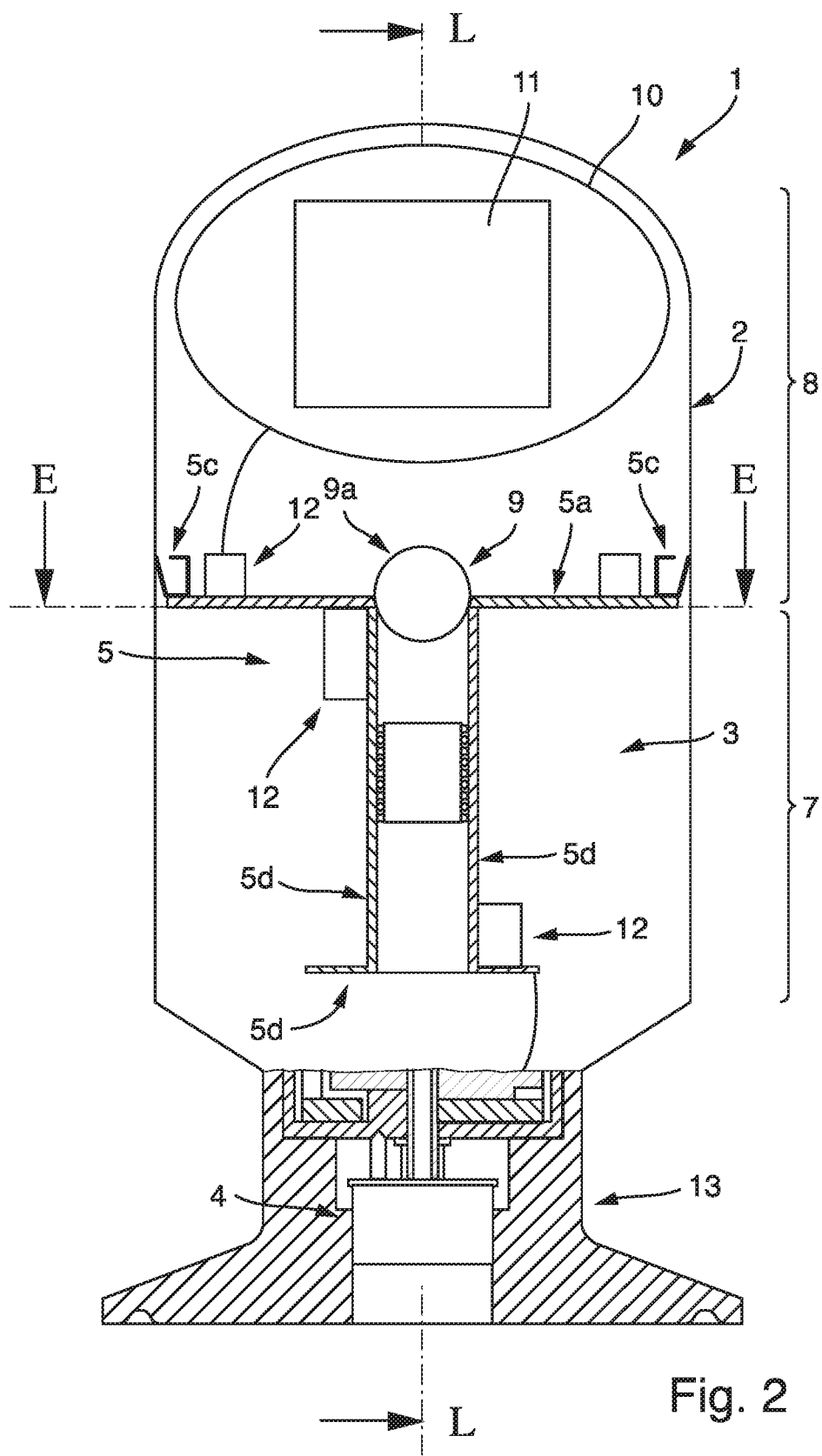
FIG. 2 shows a cross section of an automation field device of the present disclosure.

FIG. 2 shows an automation field device 1 of the invention, which includes a housing 2, which encloses an inner space 3, which has a cross sectionally round, inner contour.

Figure 1A:
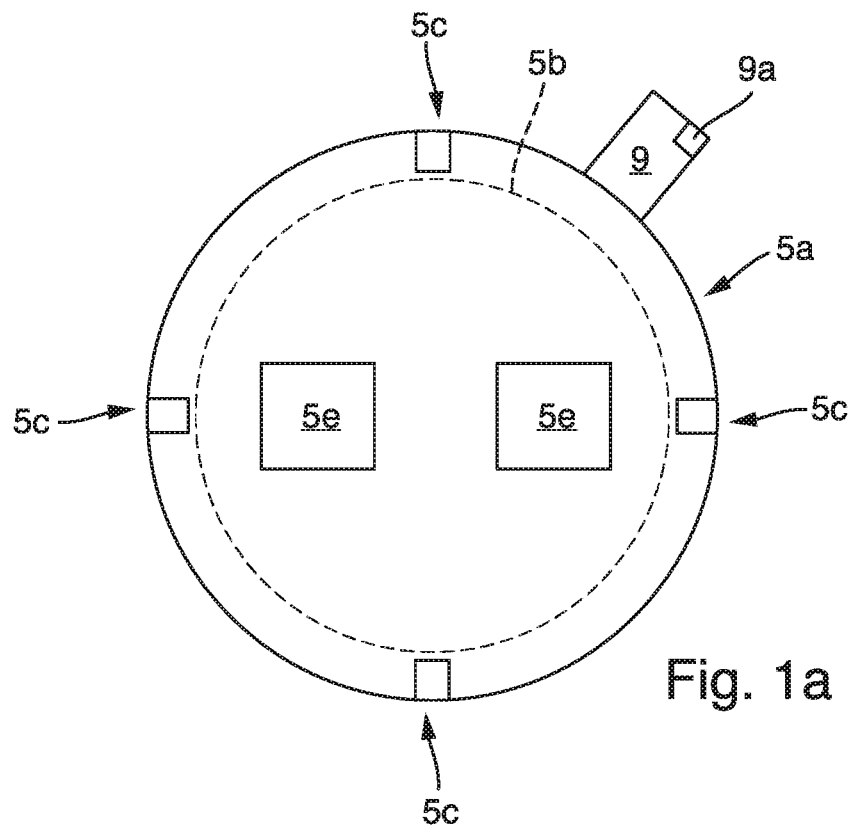
FIG. 1a shows a plan view of a first circuit board for an electronic circuit of a field device.
Figure 1B:
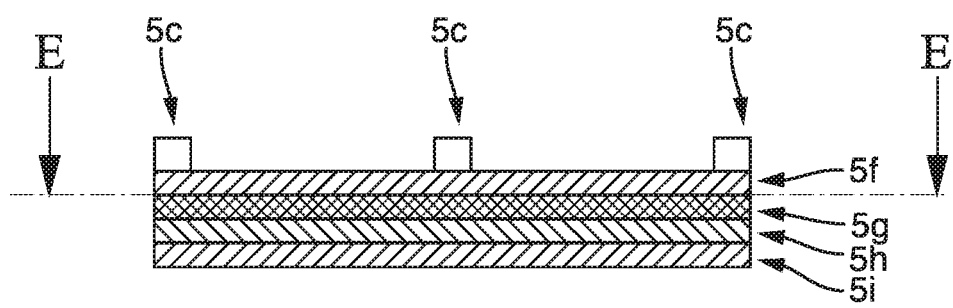
FIG. 1b shows a side view of the first circuit board shown in FIG. 1 for an electronic circuit of a field device.

Field device 1 includes, furthermore, a sensor- and/or actuator element 4 arranged at the housing 2 for setting and/or registering a process variable, as well as, located in the inner space 3 an electronic circuit 5, which is embodied to operate the sensor- and/or actuator element 4. According to the invention, the electronic circuit 5 includes a first circuit board 5a, which can be embodied as above described. The first circuit board 5a is introduced into the inner space with a main plane (labeled "E" in FIGS. 1b and 2) lying orthogonally to a longitudinal axis. The longitudinal axis is labeled "L" in FIG. 2. The first circuit board 5a is held in the inner space 3 by the spring contacts 5c arranged in the edge region 5b, especially by the outwardly bent legs of the spring contacts 5c. Furthermore, disturbance currents are drained from the first circuit board 5a to the housing 2 by the spring contacts 5c, especially by the outwardly bent legs of the spring contacts 5c. Furthermore, the orthogonal orientation of the first circuit board 5a relative to the longitudinal axis of the inner space divides the housing 2 into two regions, or chambers, namely a first, non-EMC shielded region and a second, EMC shielded region. The non-EMC shielded region is located, in such case, preferably in the upper part of the field device 1. In this part of the field device 1, the housing 2 includes, furthermore, a lid, in or on which a display 11 is mounted. Display 11 is electrically connected, for example, via a plug-in connection 12, with the electronic circuit 5 via a circuit board 10 for driving the display.

Field device 1 includes, additionally, a field device interface 9, via which the electronic circuit 5 of the field device 1 is connected, depending on embodiment, either to a two-, three or four-wire line, in order to communicate data, especially measuring- and/or actuating values, between the electrical circuit and a superordinated unit. Field device interface 9 can be embodied, for example, in the form of a plug connector, for example, a M12 plug connector interface. Furthermore, the field device interface 9 can have an electrical ground contact 9a, via which the first circuit board 5a is connected with the field device interface 9, in order to drain off disturbance currents. The ground contact 9a can be embodied as part of the field device interface 9. Alternatively, the grounding can also occur via the housing 2 and a process connector 13, via which the field device 1 is secured, for example, to a tank, or container.

The electronic circuit 5 can, such as shown in FIG. 2, be formed by a plurality of other circuit boards 5d, wherein the circuit boards 5a, 5d are plugged into one another via plug connections 12 and are, thus, in electrical contact with one another. In order to achieve an as great space saving construction as possible, the circuit boards 5a, 5d can be tilted, or rotated, relative to one another. For example, such as shown in FIG. 2, two other circuit boards 5d can extend orthogonally from the first circuit board 5a, on which, in turn, at an end far from the first circuit board 5a, another circuit board 5d is mounted.

The invention claimed is:

1. An automation field device, comprising:
a housing surrounding an inner space and having a cross sectionally round, inner contour;
a sensor and/or actuator element arranged at the housing and configured to set and/or register a process variable; and
an electronic circuit arranged in the housing and configured to operate the sensor and/or actuator element, wherein the electronic circuit has at least one circuit board with a round, outer contour and a plurality of spring contacts in an edge region, wherein the inner contour of the housing and the outer contour of the first circuit board are so adapted to one another that the first circuit board is introducible into the housing with a main plane, in which it is embodied, lying orthogonally to a longitudinal axis, which extends through the inner space of the housing, and the spring contacts are so arranged on the first circuit board and embodied to hold at least the first circuit board in this position in the inner space and to produce an electrical connection between the first circuit board and the housing to drain away disturbance currents from the first circuit board via the spring contacts to the housing.

2. The automation field device as claimed in claim 1, wherein the spring contacts are arranged rotationally symmetrically in the edge region of the first circuit board.

3. The automation field device as claimed in claim 1, wherein the electronic circuit further includes at least one other circuit board that is electrically connected with the first circuit board, and wherein the first circuit board further includes electronic components embodied to implement electromagnet compatibility (EMC) measures.

4. The automation field device as claimed in claim 3, wherein the first circuit board has a plurality of plies of which at least one ply is a continuous copper ply such that the first circuit board divides the inner space into an EMC shielded region and a non-EMC shielded region.

5. The automation field device as claimed in claim 1, further comprising:
   a field device interface mounted in the housing for data communication, wherein the field device interface has an electrical ground contact via which the first circuit board is connected with the field device interface to drain away disturbance currents.

6. The automation field device as claimed in claim 5, wherein the field device interface is an M12 plug connector.

* * * * *